(12) United States Patent
Koyama et al.

(10) Patent No.: US 9,496,138 B2
(45) Date of Patent: Nov. 15, 2016

(54) METHOD FOR MANUFACTURING OXIDE SEMICONDUCTOR FILM, METHOD FOR MANUFACTURING SEMICONDUCTOR DEVICE, AND SEMICONDUCTOR DEVICE

(75) Inventors: Masaki Koyama, Atsugi (JP); Kosei Nei, Atsugi (JP);
(Continued)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 266 days.

(21) Appl. No.: 13/535,523

(22) Filed: Jun. 28, 2012

(65) Prior Publication Data
US 2013/0009147 A1   Jan. 10, 2013

(30) Foreign Application Priority Data

Jul. 8, 2011 (JP) .................. 2011-152143
Oct. 28, 2011 (JP) .................. 2011-237087

(51) Int. Cl.
*H01L 21/36* (2006.01)
*H01L 21/02* (2006.01)
(Continued)

(52) U.S. Cl.
CPC ... *H01L 21/02565* (2013.01); *H01L 21/02422* (2013.01); *H01L 21/02488* (2013.01);
(Continued)

(58) Field of Classification Search
CPC ............... H01L 21/02472; H01L 21/02483; H01L 29/78609; H01L 51/0082; H01L
(Continued)

(56) References Cited

U.S. PATENT DOCUMENTS 5,731,856 A  3/1998  Kim et al.
5,744,864 A  4/1998  Cillessen et al.
(Continued)

FOREIGN PATENT DOCUMENTS

CN  1941299  4/2007
CN  101356652  1/2009
(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Kenneth Parker
*Assistant Examiner* — Bo Fan
(74) *Attorney, Agent, or Firm* — Robinson Intellectual Property Law Office; Eric J. Robinson

(57) ABSTRACT

In an oxide semiconductor film formed over an insulating surface, an amorphous region remains in the vicinity of the interface with the base, which is thought to cause a variation in the characteristics of a transistor and the like. A base surface or film touching the oxide semiconductor film is formed of a material having a melting point higher than that of a material used for the oxide semiconductor film. Accordingly, a crystalline region is allowed to exist in the vicinity of the interface with the base surface or film touching the oxide semiconductor film. An insulating metal oxide is used for the base surface or film touching the oxide semiconductor film. The metal oxide used here is an aluminum oxide, gallium oxide, or the like that is a material belonging to the same group as the material of the oxide semiconductor film.

10 Claims, 13 Drawing Sheets

(75) Inventors: Akihisa Shimomura, Atsugi (JP);
Suguru Hondo, Atsugi (JP); Toru Hasegawa, Atsugi (JP)

(51) Int. Cl.
*H01L 29/786* (2006.01)
*H01L 29/66* (2006.01)

(52) U.S. Cl.
CPC ... *H01L 21/02554* (2013.01); *H01L 21/02631* (2013.01); *H01L 21/02686* (2013.01); *H01L 29/66969* (2013.01); *H01L 29/7869* (2013.01); *H01L 29/78603* (2013.01); *H01L 29/78606* (2013.01)

(58) Field of Classification Search
CPC ............... 2924/10337;H01L 21/02565; H01L 29/66969; H01L 21/02422; H01L 29/78603; H01L 21/02631; H01L 21/02488; H01L 21/02686; H01L 21/02554; H01L 29/7869; H01L 29/78606
USPC ............. 257/40, 192, 59, E33.001, E21.476, 257/E29.273; 438/795, 104
See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,597,757 B2 | 10/2009 | Conley, Jr. |
| 7,598,520 B2 | 10/2009 | Hirao et al. |
| 7,674,650 B2 | 3/2010 | Akimoto et al. |
| 7,732,819 B2 | 6/2010 | Akimoto et al. |
| 7,824,957 B2 | 11/2010 | Umeda et al. |
| 7,910,490 B2 | 3/2011 | Akimoto et al. |
| 7,932,521 B2 | 4/2011 | Akimoto et al. |
| 7,968,368 B2 | 6/2011 | Wakana et al. |
| 7,993,964 B2 | 8/2011 | Hirao et al. |
| 8,274,077 B2 | 9/2012 | Akimoto et al. |
| 8,466,463 B2 | 6/2013 | Akimoto et al. |
| 8,629,069 B2 | 1/2014 | Akimoto et al. |
| 8,629,432 B2 | 1/2014 | Sakata et al. |
| 8,669,550 B2 | 3/2014 | Akimoto et al. |
| 8,790,959 B2 | 7/2014 | Akimoto et al. |
| 8,796,069 B2 | 8/2014 | Akimoto et al. |
| 8,884,287 B2 | 11/2014 | Sakata et al. |
| 9,099,562 B2 | 8/2015 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1* | 3/2006 | Hoffman ............ H01L 29/7869 257/72 |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0121700 A1* | 6/2006 | Peng ................ H01L 21/02241 438/483 |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1* | 3/2007 | Akimoto ............ H01L 27/1225 438/795 |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0278490 A1 | 12/2007 | Hirao et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308805 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0140255 A1* | 6/2009 | Kimura ............ H01L 29/66757 257/64 |
| 2009/0152506 A1 | 6/2009 | Umeda et al. |
| 2009/0152541 A1 | 6/2009 | Maekawa et al. |
| 2009/0189252 A1* | 7/2009 | Passlack ................ H01L 29/20 257/615 |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0123132 A1 | 5/2010 | Nakata et al. |

(56) References Cited

U.S. PATENT DOCUMENTS

| | | | |
|---|---|---|---|
| 2010/0136743 | A1 | 6/2010 | Akimoto et al. |
| 2010/0320458 | A1* | 12/2010 | Umeda ............... C01G 15/006 257/43 |
| 2010/0320459 | A1 | 12/2010 | Umeda et al. |
| 2011/0062436 | A1 | 3/2011 | Yamazaki et al. |
| 2011/0104851 | A1 | 5/2011 | Akimoto et al. |
| 2011/0117697 | A1 | 5/2011 | Akimoto et al. |
| 2011/0121289 | A1* | 5/2011 | Miyanaga ........... H01L 29/7869 257/43 |
| 2011/0121290 | A1 | 5/2011 | Akimoto et al. |
| 2011/0127579 | A1* | 6/2011 | Yamazaki ......... H01L 21/02472 257/192 |
| 2011/0140172 | A1* | 6/2011 | Chu ................... H01L 29/4175 257/194 |
| 2011/0163311 | A1 | 7/2011 | Akimoto et al. |
| 2012/0256179 | A1 | 10/2012 | Yamazaki et al. |
| 2015/0340513 | A1 | 11/2015 | Akimoto et al. |

FOREIGN PATENT DOCUMENTS

| | | |
|---|---|---|
| CN | 101931009 | 12/2010 |
| CN | 102405521 | 4/2012 |
| EP | 1737044 A | 12/2006 |
| EP | 1770788 A | 4/2007 |
| EP | 1995787 A | 11/2008 |
| EP | 1998373 A | 12/2008 |
| EP | 1998374 A | 12/2008 |
| EP | 1998375 A | 12/2008 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-193446 A | 7/2004 |
| JP | 2004-273614 A | 9/2004 |
| JP | 2004-273732 A | 9/2004 |
| JP | 2006-165528 A | 6/2006 |
| JP | 2007-123861 A | 5/2007 |
| JP | 2007-137757 A | 6/2007 |
| JP | 2008-042088 A | 2/2008 |
| JP | 2009-021612 A | 1/2009 |
| JP | 2009-290111 A | 12/2009 |
| JP | 2010-123758 A | 6/2010 |
| JP | 2010-186994 A | 8/2010 |
| JP | 2010-192560 A | 9/2010 |
| JP | 2010-267704 A | 11/2010 |
| JP | 2011-003856 A | 1/2011 |
| JP | 2011-029238 A | 2/2011 |
| JP | 2011-135064 A | 7/2011 |
| KR | 2008-0066678 A | 7/2008 |
| KR | 2010-0137379 A | 12/2010 |
| WO | WO-2004/114391 | 12/2004 |
| WO | WO-2007/142167 | 12/2007 |
| WO | WO-2010/010802 | 1/2010 |
| WO | WO-2010/131311 | 11/2010 |
| WO | WO-2011/065210 | 6/2011 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—$ZnO$ system at 1350° C,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—$ZnO$ System,", Journal of Solid State Chemistry, Apr. 1, 1995, vol. 116, No. 1, pp. 170-178.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films,", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)_m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—$ZnO$) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer,", Adv. Mater. (Advanced Materials), 2006, vol. 18, No. 3, pp. 339-342.

(56) References Cited

OTHER PUBLICATIONS

Tsuda.K et al., "Ultra Low Power Consumption Technologies for Mobile TFT-LCDs,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for Amoled Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hosono.H, "68.3:Invited Paper:Transparent Amorphous Oxide Semiconductors for High Performance TFT,", SID Digest '07 : SID Interanational Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Sympsium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED,", IDW'06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YBFE2O4, and YB2FE3O7 Types of Structures for Compounds in the In2O3 and SC2O3—A2O3-BO Systems [A; Fe, Ga, or Al; B: Mg, Mn, Fe, Ni, Cu,or Zn] at Temperatures Over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev.Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZn04,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID Internation Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B. (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

(56) References Cited

OTHER PUBLICATIONS

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW'08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectrics Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

International Search Report (Application No. PCT/JP2012/004336) Dated Oct. 16, 2012.

Written Opinion (Application No. PCT/JP2012/004336) Dated Oct. 16, 2012.

Nomura.K et al., "Thin-Film Transistor Fabricated in Single-Crystalline Transparent Oxide Semiconductor,", Science, May 23, 2003, vol. 300, No. 5623, pp. 1269-1272.

Nakata.M et al., "Flexible High-Performance Amorphous InGaZnO4 Thin-Film Transistors Utilizing Excimer Laser Annealing,", Jpn. J. Appl. Phys. (Japanese Journal of Applied Physics) , Aug. 25, 2009, vol. 48, No. 8, pp. 081607-1-081607-7.

Hirao.T et al., "Novel Top-Gate Zinc Oxide Thin-Film Transistors (ZNO TFTS) for AMLCDS,", Journal of the SID, 2007, vol. 15, No. 1, pp. 17-22.

\* cited by examiner

METHOD FOR MANUFACTURING OXIDE SEMICONDUCTOR FILM, METHOD FOR MANUFACTURING SEMICONDUCTOR DEVICE, AND SEMICONDUCTOR DEVICE

BACKGROUND OF THE INVENTION

1. Field of the Invention

The present invention relates to an oxide semiconductor and a semiconductor device including a transistor using the oxide semiconductor in a channel region.

2. Description of the Related Art

An oxide semiconductor has attracted attention as a material for transistors. The oxide semiconductor is said to have a feature similar to that of amorphous silicon capable of being formed at a low temperature, and a feature similar to that of polycrystalline silicon having high field-effect mobility. For example, the following is disclosed: a field-effect transistor using an amorphous oxide, whose electron carrier concentration is controlled, and an image display device using the transistor (Patent Document 1).

The transistor using an amorphous oxide semiconductor formed at room temperature, however, has a problem in characteristics: not enough high field-effect mobility, low reliability, and large hysteresis. In order to solve such a problem, a technique of crystallizing an oxide semiconductor by laser irradiation is disclosed (Patent Documents 2 and 3). These documents show that laser irradiation performed on an oxide semiconductor film allows crystallization of an amorphous oxide semiconductor.

REFERENCE

Patent Document

[Patent Document 1] Japanese Published Patent Application No. 2006-165528
[Patent Document 2] Japanese Published Patent Application No. 2008-042088
[Patent Document 3] Japanese Published Patent Application No. 2010-123758

SUMMARY OF THE INVENTION

In crystallization of oxide semiconductors and other semiconductors, there is a problem in that an amorphous region remains in the vicinity of the interface between a base and a semiconductor layer to be crystallized. For example, in the case where an element such as a transistor is manufactured using an oxide semiconductor film, the thin film is formed on a base such as a glass substrate or an insulating film like a silicon oxide film. In crystallization of an oxide semiconductor film formed on such an insulating material different from the oxide semiconductor, the problem arises in that a region near the interface with the base cannot be crystallized and an amorphous region remains.

It is needless to say that the oxide semiconductor film can be made thick so that a crystalline region in a surface layer is used. In order to reduce parasitic capacitance and operate the transistor at low power consumption, however, the oxide semiconductor film needs to be made thin so that the channel region is completely depleted. In that case, conventional techniques, which have difficulty in crystallizing the immediate vicinity of the interface with the base, prevent miniaturization of transistors.

Thus, even when the upper layer side of the oxide semiconductor film is crystallized, an amorphous region remains at the interface with the base insulating film, which has adversely affected the characteristics of transistors and the like.

In order to solve the above problems, an object of the disclosed invention is to improve the crystallinity of an oxide semiconductor, specifically, to provide a crystalline oxide semiconductor film having a region in which crystallization proceeds into the interface with a base or the vicinity thereof. Another object of the disclosed invention is to provide a semiconductor device using such an oxide semiconductor film.

A base surface or film touching an oxide semiconductor film is formed of a material having a melting point higher than that of a material used for the oxide semiconductor film. Accordingly, a crystalline region is allowed to exist in the vicinity of the interface with the base surface or film touching the oxide semiconductor film.

The oxide semiconductor film is crystallized by irradiation with an energy beam, typically a laser beam. As the laser beam emitted to the oxide semiconductor film, a pulsed laser beam is preferably used. This is because a region irradiated with the laser beam can be instantaneously heated to a temperature which allows crystallization without causing thermal damage to a substrate over which the oxide semiconductor film is formed.

The laser beam heating the oxide semiconductor film preferably has a short wavelength with energy higher than the band gap of the oxide semiconductor, whereby the laser beam is absorbed in the oxide semiconductor film.

Note that the laser beam emitted to the oxide semiconductor film does not need to be completely absorbed in the oxide semiconductor film. When the oxide semiconductor film is irradiated with the laser beam, the oxide semiconductor film is heated to a high temperature. If the laser beam is not absorbed in the oxide semiconductor film and reaches the base surface or the base film, it may be absorbed in and heat the base surface or the base film. In any case, the oxide semiconductor film is instantaneously heated to a very high temperature (melting point or a temperature close to the melting point). In the case where the base surface or film touching the oxide semiconductor film is made of a material having a melting point higher than the temperature to which the oxide semiconductor is heated, the material of the base surface or the base film is not melted, which prevents contamination of the oxide semiconductor with the melted material.

The base surface or film touching the oxide semiconductor film is preferably formed of a material containing an element of Group 13 which is the same group as one of the elements included in the oxide semiconductor, or an element of Group 3 which has a property similar to that of the element of Group 13. For example, in the case of an oxide semiconductor including an oxide of indium and zinc, it is preferable to use an insulating metal oxide including an element belonging to the same group as indium, namely, Group 13, or an element having a property similar to that of the element of Group 13, namely an element of Group 3. As the element of Group 3, a lanthanum-based element such as cerium or gadolinium may be used. As the metal oxide, aluminum oxide or gallium oxide is preferably selected as an example.

Consideration will be given to the melting point of materials used for the base surface or film touching the oxide semiconductor film. Materials used for the oxide semiconductor that is to be compared have the following melting point: indium oxide, 1565° C.; and zinc oxide, 1975° C. On the other hand, aluminum oxide has a melting point of 2020°

C., and thus is not melted even when indium oxide or zinc oxide is heated to a temperature high enough to be instantaneously melted. Thus, the oxide semiconductor film can be prevented from being contaminated with the metal of the base. As another metal oxide, gadolinium oxide (melting point: 2310° C.), zirconium oxide (melting point: 2715° C.), yttria-stabilized zirconia (melting point: 2700° C.), cerium oxide (melting point: 1950° C.), or the like can be used.

On the other hand, silicon oxide, which has a melting point of 1614° C. to 1710° C., is expected to be melted in the case where indium oxide or zinc oxide is heated by a laser beam to a temperature high enough to be instantaneously melted. In that case, silicon which belongs to Group 14 different from that of a constituent element of the oxide semiconductor might inhibit crystallization of the oxide semiconductor.

An oxide semiconductor film manufactured by irradiation with an energy beam, that is, a non-single-crystal oxide semiconductor film preferably includes a crystalline region having c-axis alignment. That is, a non-single-crystal oxide semiconductor film preferably includes a crystalline region in which the c-axis is aligned, a triangular or hexagonal atomic arrangement is included when seen from the direction of the a-b plane, the surface, or the interface, metal atoms are arranged in a layered manner or metal atoms and oxygen atoms are arranged in a layered manner along the c-axis, and the direction of the a-axis or the b-axis is varied in the a-b plane (or the surface or the interface), that is, the crystal rotates around the c-axis. Hereinafter, such a non-single-crystal thin film is also referred to as a "thin film including CAAC-OS". Note that CAAC-OS is the abbreviation of c-axis aligned crystalline oxide semiconductor. In other words, the thin film including CAAC-OS is crystallized along the c-axis and crystals are not always aligned with respect to the a-b plane.

In a broad sense, the thin film including CAAC-OS means a non-single-crystal material including a phase which has a triangular, hexagonal, regular triangular, or regular hexagonal atomic arrangement when seen from the direction perpendicular to the a-b plane, and in which metal atoms are arranged in a layered manner or metal atoms and oxygen atoms are arranged in a layered manner when seen from the direction perpendicular to the c-axis.

Note that the thin film including CAAC-OS is not a single-crystal thin film, but is not entirely amorphous. In addition, the thin film including CAAC-OS includes a crystallized portion (crystalline portion), but a grain boundary between one crystalline portion and another crystalline portion is not always identified by transmission electron microscope (TEM) or the like.

In the case where oxygen is contained in the CAAC-OS, nitrogen may be substituted for part of oxygen. The c-axes of individual crystalline portions included in the thin film including CAAC-OS may be aligned in one direction (e.g., the direction perpendicular to a surface of a substrate over which the thin film including CAAC-OS is formed, or a surface, an interface, or the like of the thin film including CAAC-OS). Alternatively, normals of the a-b planes of individual crystalline portions included in the thin film including CAAC-OS may be aligned in one direction (e.g., the direction perpendicular to the substrate surface or the surface or interface of the thin film including CAAC-OS). As an example of such a thin film including CAAC-OS, there is a material which is formed into a film shape and has a triangular or hexagonal atomic arrangement when observed from the direction perpendicular to a surface of a film, a surface of a substrate, or an interface and in which metal atoms are arranged in a layered manner or metal atoms and oxygen atoms (or nitrogen atoms) are arranged in a layered manner when a cross section of the film is observed.

When an oxide semiconductor film includes a crystalline region having c-axis alignment, improvement in carrier-transport properties (e.g., mobility) is expected and structure stabilization is achieved, which can result in improvement in properties and reliability of an element using such an oxide semiconductor film.

In order that a crystalline region is included in an oxide semiconductor film, materials for a base surface or film touching the oxide semiconductor film are selected as appropriate in the aforementioned manner, and moreover, it is preferable to remove impurities contained in the oxide semiconductor film itself. The impurities contained in the oxide semiconductor film are hydrogen, a hydroxyl group, water, and the like. Since hydrogen, a hydroxyl group, water, and the like can be contained in the process of forming the oxide semiconductor film, gas (hydrogen, water vapor, and the like) remaining in a deposition chamber is preferably reduced as much as possible. In addition, the oxide semiconductor film is preferably subjected to heat treatment to be dehydrated or dehydrogenated, whereby hydrogen, a hydroxyl group, water, and the like are removed.

One embodiment of the present invention is a method for manufacturing an oxide semiconductor film, including the steps of: forming an oxide semiconductor film containing an oxide of at least one of indium and zinc so as to be in contact with an insulating metal oxide film; and heating the oxide semiconductor film by irradiation with an energy beam so that the oxide semiconductor film includes a crystalline region. It is preferable that the insulating metal oxide film have a melting point higher than that of the oxide of indium or zinc.

One embodiment of the present invention is a method for manufacturing a semiconductor device, including the steps of: forming an insulating metal oxide film; forming an oxide semiconductor film containing an oxide of at least one of indium and zinc so as to be in contact with the insulating metal oxide film; irradiating the oxide semiconductor film with an energy beam so that the oxide semiconductor film includes a crystalline region; and forming a transistor in which the oxide semiconductor film including the crystalline region is used as a channel formation region. It is preferable that the insulating metal oxide film have a melting point higher than that of the oxide of indium or zinc. A gate electrode can be formed before or after the insulating metal oxide film is formed.

One embodiment of the present invention is a semiconductor device including: an insulating metal oxide film; and an oxide semiconductor film which is in contact with the insulating metal oxide film, contains an oxide of at least one of indium and zinc, and includes a crystalline region with c-axis alignment. The crystalline region with c-axis alignment in the oxide semiconductor film also exists in the vicinity of the interface with the insulating metal oxide film. It is preferable that the insulating metal oxide film have a melting point higher than that of the oxide of indium or zinc.

In this specification, when a component is "over" or "under" another component, the former component may be directly formed on the latter component, or still another component may be provided therebetween.

In this specification, terms in a singular form which are used for description of the embodiments include a concept of plural, unless it is contextually clear that a singular form or a plural form is intentionally used. Terms such as "include" and "have" indicate the existence of a feature, a number, a step, an operation, a component, a member, or a combination of any of these, which is described in this specification, and do not exclude the possibility that one or more other features, numbers, steps, operations, components, members, combinations of any of these, or the like may exist or be added.

Unless otherwise specifically defined in this specification, all the terms that are used including the technical or scientific terms have the same meaning as the one generally understood by those who have conventional knowledge in the technical field to which the present invention belongs. The terms that are the same as the ones defined in a commonly-used dictionary should be interpreted as including the meaning consistent with the meaning in the context of the related art, and should not be interpreted as being ideally or excessively formal unless they are defined clearly in this specification.

According to one embodiment of the present invention, a base surface or film touching an oxide semiconductor film is formed of a material having a melting point higher than that of a material used for the oxide semiconductor film, and an energy beam is emitted to the oxide semiconductor film, whereby the crystallinity of the oxide semiconductor film can be improved. That is, a crystalline region is allowed to exist in the vicinity of the interface with the base surface or film touching the oxide semiconductor film and in the vicinity of the interface with an insulating film formed on the base side.

DETAILED DESCRIPTION OF THE INVENTION

Figure 1A:
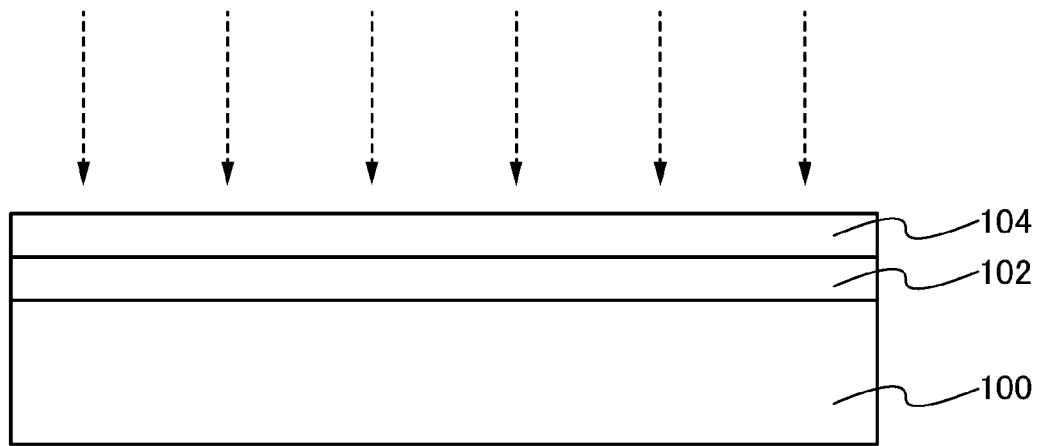
FIGS. 1A and 1B are diagrams illustrating a method for manufacturing an oxide semiconductor film according to one embodiment of the present invention.

Embodiment of the invention disclosed in this specification will be described with reference to drawings. Note that the invention disclosed in this specification is not limited to the following embodiment, and it is apparent to those skilled in the art that modes and details can be modified in a wide variety of ways without departing from the spirit and scope of the invention. Therefore, the disclosed invention is not interpreted as being limited to the description of the embodiment below.

In the embodiment described below, the same parts are sometimes denoted with the same reference numerals in different drawings. Note that the thickness, the width, a relative position, and the like of components, namely, layers, regions, and the like illustrated in the drawings are exaggerated in some cases for clarification in the description of the embodiment.

Figure 1B:
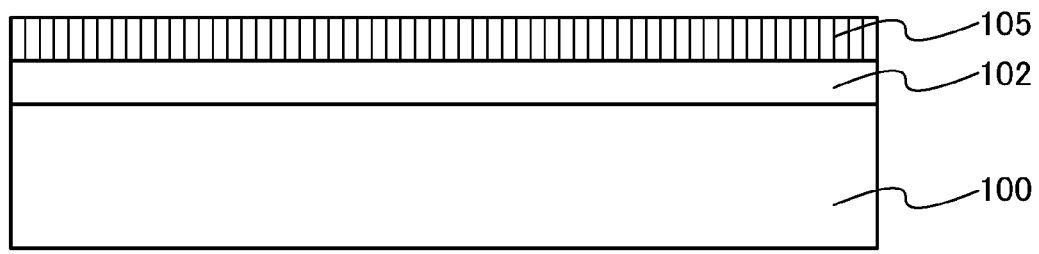

FIGS. 1A and 1B illustrate a method for manufacturing an oxide semiconductor film according to one embodiment of the present invention. In FIG. 1A, a metal oxide film 102 is provided over a substrate 100 and an oxide semiconductor film 104 is formed thereover.

The metal oxide film 102 is formed of a material containing an element of Group 13 which is the same group as one of the elements included in the oxide semiconductor film 104, or an element of Group 3 which has a property similar to that of the element of Group 13. For example, in the case where the oxide semiconductor film 104 is formed of an oxide semiconductor material containing oxides of indium and zinc, the metal oxide film 102 is preferably formed using an insulating metal oxide including an element belonging to the same group as indium, namely, Group 13, or an element having a property similar to that of the element of Group 13, namely an element of Group 3. As the element of Group 3, a lanthanum-based element such as cerium or gadolinium may be used. As the metal oxide, aluminum oxide or gallium oxide is preferably selected as an example.

The material of the metal oxide film 102 preferably has a melting point higher than that of the material of the oxide semiconductor film 104. This is because, if the metal oxide film 102 is melted when the oxide semiconductor film 104 is heated to a temperature close to its melting point, crystallization of the oxide semiconductor film 104 might be inhibited. Also, if the metal oxide film 102 is melted when the oxide semiconductor film 104 is heated, elements in the metal oxide film 102 might be diffused into the oxide semiconductor film 104 to cause contamination. In the case where the metal oxide film 102 is formed of a material having a melting point higher than that of the oxide semiconductor film 104, the metal oxide film 102 is not melted, which prevents contamination of the oxide semiconductor film 104 with the impurity element.

Indium oxide and zinc oxide, which can be used as materials for the oxide semiconductor film 104, have melting points of 1565° C. and 1975° C., respectively. On the other hand, aluminum oxide that can be used for the metal oxide film 102 has a melting point of 2020° C. Aluminum oxide is not melted even when indium oxide or zinc oxide is heated to a temperature high enough to be instantaneously melted. Thus, the oxide semiconductor film 104 can be prevented from being contaminated with the metal of the base. Instead of aluminum oxide, gadolinium oxide (melting point: 2310° C.), zirconium oxide (melting point: 2715° C.), yttria-stabilized zirconia (melting point: 2700° C.), cerium oxide (melting point: 1950° C.), or the like can also be used.

On the other hand, silicon oxide, which has a melting point of 1614° C. to 1710° C., is expected to be melted in the case where indium oxide or zinc oxide is heated by a laser beam to a temperature high enough to be instantaneously melted. In that case, silicon which belongs to Group 14 different from that of a constituent element of the oxide semiconductor might inhibit crystallization of the oxide semiconductor film 104.

An oxide semiconductor containing In (indium) atoms, Ga (gallium) atoms, and Zn (zinc) atoms, so-called IGZO, was mixed with Si (silicon) atoms, and the change in the structure of IGZO was studied by classical molecular dynamics simulation. In classical molecular dynamics simulation, empirical potential characterizing interaction between atoms is defined, whereby force acting on each atom is evaluated, and Newton's equation of motion is numerically solved, whereby motion (time-dependent change) of each atom can be deterministically tracked.

Calculation models and calculation conditions are as follows. Note that in the calculation, the Born-Mayer-Huggins potential was used.

Figure 9:
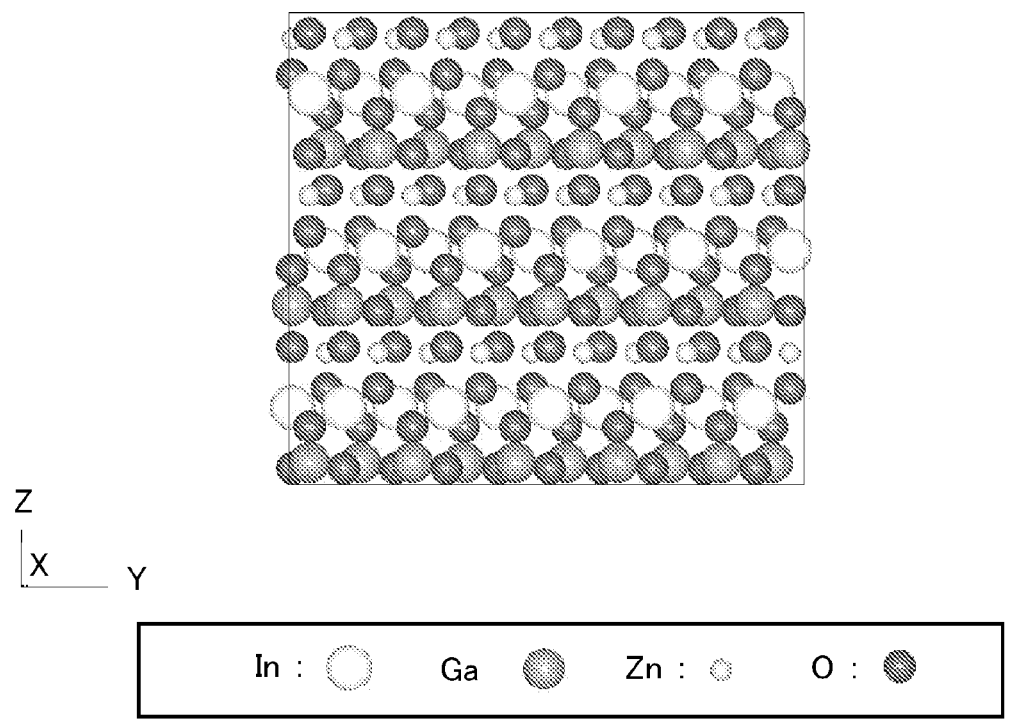
FIG. 9 is a model diagram showing a single crystal structure of $InGaZnO_4$.
Figure 10:
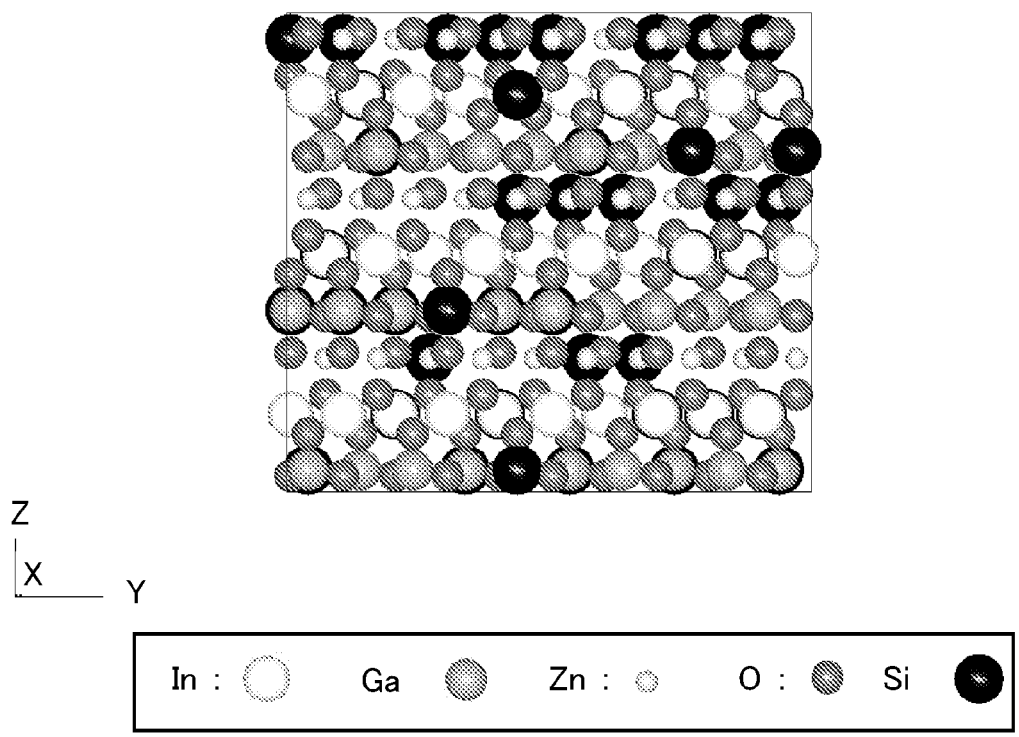
FIG. 10 is a diagram showing a Si substitution model.

A single crystal structure of InGaZnO$_4$ including 1680 atoms (see FIG. 9) and a structure of InGaZnO$_4$ including 1680 atoms in which 20 atoms of each of In, Ga, and Zn were substituted by Si atoms (see FIG. 10) were formed. In the Si substitution model, Si atoms were included at 3.57 atoms % (2.34 wt %). The density of the single crystal model was 6.36 g/cm$^3$, and the density of the Si substitution model was 6.08 g/cm$^3$.

At 1727° C. which is equal to or lower than the melting point of the InGaZnO$_4$ single crystal (about 2000° C. according to the estimation by classical molecular dynamics simulation), structure relaxation was performed by classical molecular dynamics simulation at a fixed pressure (1 atm) for 150 psec (time step width 0.2 fsec×750000 steps). The radial distribution functions g(r) of the two structures were calculated. Note that the radial distribution function g(r) is a function representing the probability density of atoms existing at a distance of r from one atom. As the correlation between atoms disappears, g(r) is close to 1.

Figure 11:
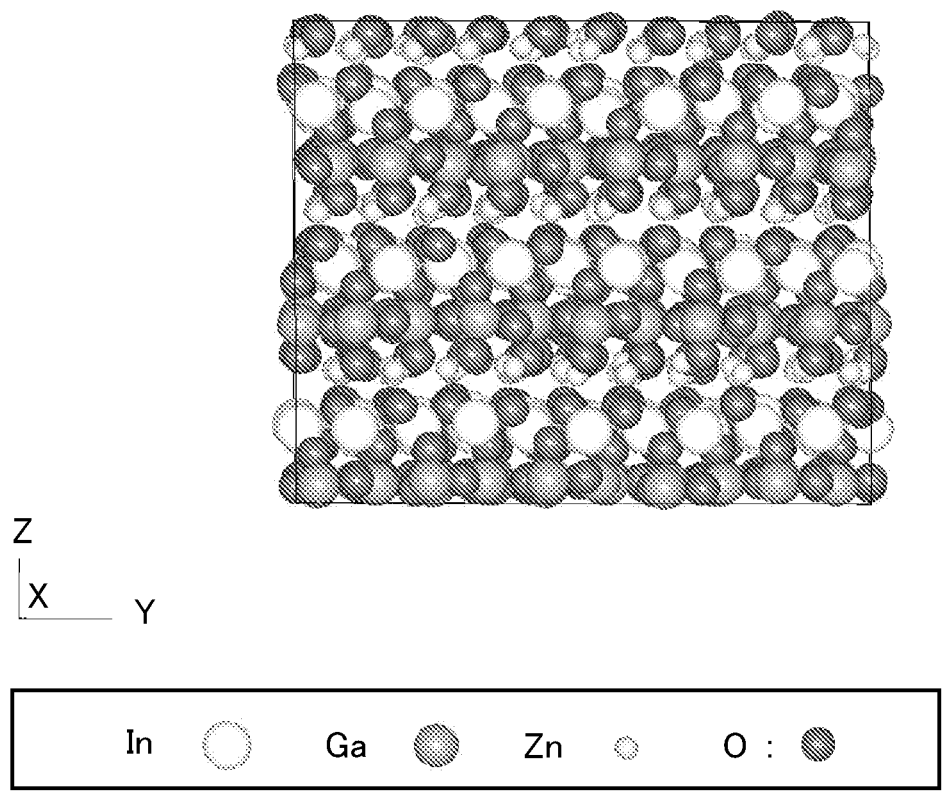
FIG. 11 is a diagram showing the final structure of the single crystal model.
Figure 12:
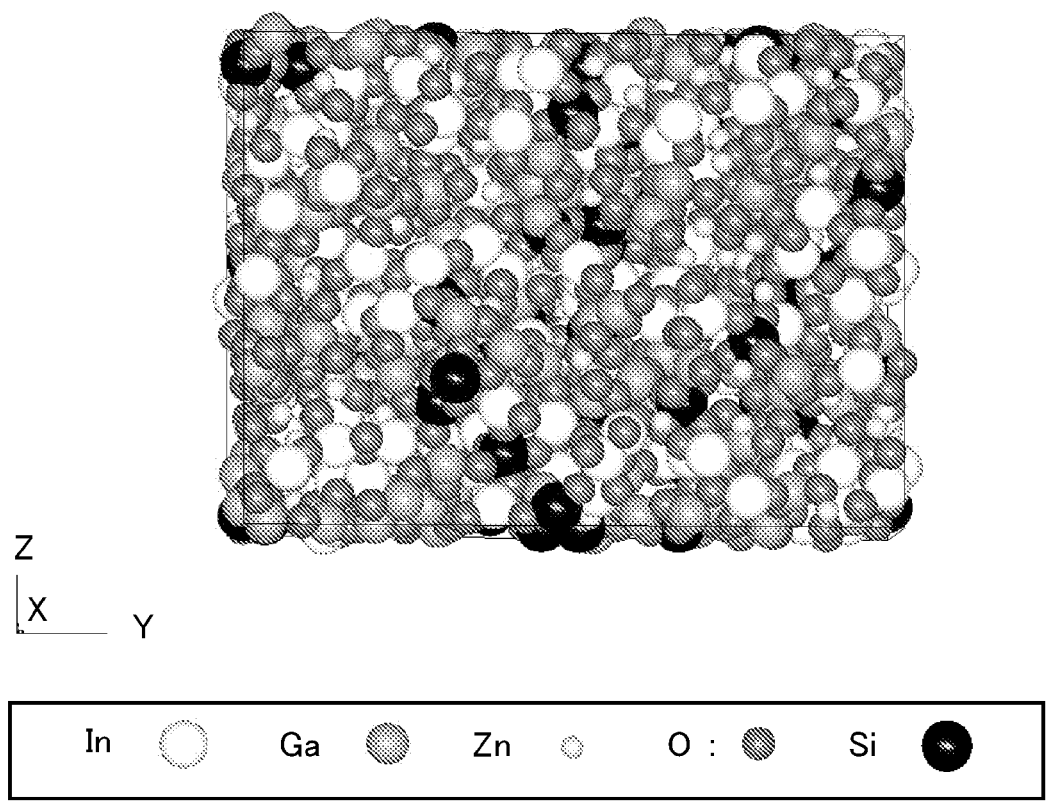
FIG. 12 is a diagram showing the final structure of the Si substitution model.
Figure 13:
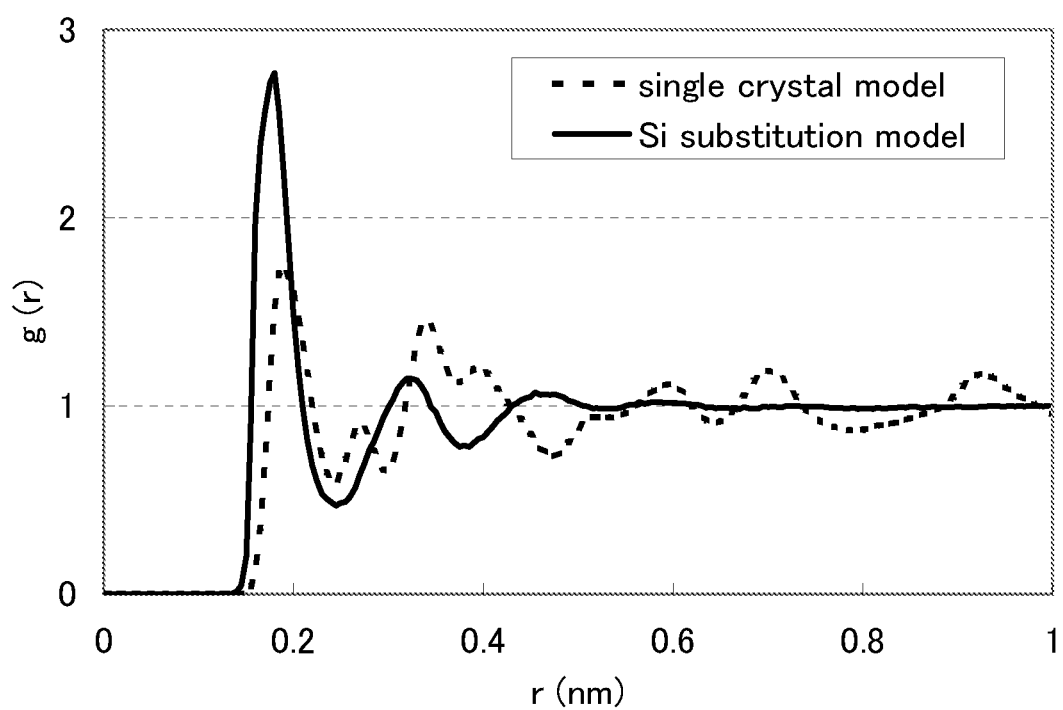
FIG. 13 is a graph showing the radial distribution function g(r) of each model.

FIG. 11 and FIG. 12 respectively show the final structures of the above two calculation models, which are obtained by performing the classical molecular dynamics simulation for 150 psec. The radial distribution function g(r) in each structure is shown in FIG. 13.

The single crystal model shown in FIG. 11 is stable and keeps the crystal structure even in the final structure, whereas the Si substitution model shown in FIG. 12 is unstable, and it can be observed that the crystal structure is distorted with time and changes into an amorphous structure. When the radial distribution functions g(r) of the structural models are compared with each other in FIG. 13, it is found that the single crystal model has peaks even at a long distance and has a long-range order. On the other hand, it is found that in the Si substitution model, the peak disappears at a distance of about 0.6 nm, and the Si substitution model does not have a long-range order.

These calculation results indicate that mixing of silicon into IGZO might inhibit crystallization of IGZO and IGZO might be made amorphous. Accordingly, in the case where silicon oxide is melted when indium oxide or zinc oxide is heated by a laser beam to a temperature high enough to be instantaneously melted, crystallization of the oxide semiconductor film 104 is thought to be inhibited by silicon which belongs to Group 14 different from that of a constituent element of the oxide semiconductor.

Note that the metal oxide film 102 can be omitted in the case where the substrate 100 is formed of an insulating metal oxide material including an element belonging to the same group as indium, namely, Group 13, or an element having a property similar to that of the element of Group 13, namely an element of Group 3. This is because in that case, a base surface of the oxide semiconductor film 104 is formed of a material including an element of Group 13 which is the same group as one of the constituent elements of the oxide semiconductor film 104, or an element of Group 3 which has a property similar to that of element of Group 13.

The oxide semiconductor film 104 is formed by sputtering or laser beam evaporation. When the oxide semiconductor film 104 is formed, as treatment before deposition, it is preferable to remove impurities such as hydrogen or moisture adsorbed in a deposition chamber and evacuate the deposition chamber, thereby preventing hydrogen or moisture from being contained in the film. In order to remove such impurities from the deposition chamber, an entrapment vacuum pump (such as a cryopump, an ion pump, or a titanium sublimation pump) is preferably used. As the evacuation unit, a turbo molecular pump to which a cold trap is added may be used.

An oxide semiconductor used for the oxide semiconductor film 104 preferably contains at least indium (In) or zinc (Zn). In particular, In and Zn are preferably contained. Further, as a stabilizer for reducing the variation in electric characteristics of a transistor using the oxide, the oxide semiconductor preferably contains gallium (Ga) in addition to In and Zn. Tin (Sn) is also preferably contained as a stabilizer. It is also preferable that one or more kinds of elements selected from hafnium (Hf), zirconium (Zr), and a lanthanum-based element (e.g., cerium (Ce), neodymium (Nd), or gadolinium (Gd)) be contained as a stabilizer.

As the oxide semiconductor, the following can be used for example: an indium oxide; a tin oxide; a zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Here, an In—Ga—Zn-based oxide refers to an oxide mainly containing In, Ga, and Zn and there is no particular limitation on the ratio of In, Ga, and Zn. An In—Ga—Zn-based oxide may contain another metal element in addition to In, Ga, and Zn.

Alternatively, a material represented by InMO$_3$(ZnO)$_m$ (m>0 is satisfied, and m is not an integer) may be used as an oxide semiconductor. Note that M represents one or more metal elements selected from Ga, Fe, Mn, and Co, or the elements described above as a stabilizer. Further alternatively, a material represented by In$_2$SnO$_5$(ZnO)$_n$ (n>0, and n is an integer) may be used as the oxide semiconductor.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is close to the above compositions can be used. Alternatively, an In—Sn—Zn-based oxide with an atomic ratio of In:Sn:

Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is close to the above compositions may be used.

Further, the oxide semiconductor film 104 may be subjected to heat treatment for removing excess hydrogen, hydroxyl groups, or water (dehydration or dehydrogenation). The heat treatment is performed at a temperature of 300° C. to 700° C., or a temperature lower than the strain point of the substrate. The heat treatment can be performed under reduced pressure, a nitrogen atmosphere, or the like. For example, the substrate 100 is put in an electric furnace that is a kind of heat treatment apparatus, and heat treatment is performed on the oxide semiconductor film 104 for one hour at 450° C. in a nitrogen atmosphere.

The oxide semiconductor film 104 is preferably heated by irradiation with an energy beam, typically a laser beam. As the laser beam emitted to the oxide semiconductor film 104, a pulsed laser beam is preferably used. This is because a region irradiated with the laser beam can be instantaneously heated to a temperature which allows crystallization without causing thermal damage to the substrate on which the oxide semiconductor film 104 is formed.

The laser beam heating the oxide semiconductor film 104 preferably has a short wavelength with energy higher than the band gap of the oxide semiconductor, whereby the laser beam is absorbed in the oxide semiconductor film 104. An example of the light source of a laser beam having such a wavelength is an excimer laser. As the excimer laser, XeCl (308 nm), KrF (248 nm), ArF (193 nm), or the like can be used. The third harmonic of a YAG laser or the like may also be used.

Note that the laser beam emitted to the oxide semiconductor film 104 does not need to be completely absorbed in the oxide semiconductor film 104. When the oxide semiconductor film 104 is irradiated with the laser beam, the oxide semiconductor film 104 is heated to a high temperature. If the laser beam is not absorbed in the oxide semiconductor film 104 and reaches the metal oxide film 102, it may be absorbed and heated in the metal oxide film 102. In any case, the oxide semiconductor film 104 is instantaneously heated to a very high temperature (melting point or a temperature close to the melting point). In the case where the metal oxide film 102 is made of a material having a melting point higher than the temperature to which the oxide semiconductor film 104 is heated, the material of the metal oxide film 102 is not melted, which prevents contamination of the oxide semiconductor with the material of the base.

The metal oxide film 102 is formed of a material having a melting point higher than that of the oxide semiconductor film 104 and the oxide semiconductor film 104 is irradiated with an energy beam to be heated, whereby a non-single-crystal oxide semiconductor film 105 including a crystalline region can be obtained (FIG. 1B). As described in the following Examples, the crystalline region included in the oxide semiconductor film 105 can be observed also in a region of 2 nm or less from the interface between the metal oxide film 102 and the oxide semiconductor film 105. The crystalline region observed in the oxide semiconductor film 105 includes a c-axis aligned crystal, and in the oxide semiconductor film 105 obtained, such a crystalline region is almost in contact with the interface between the metal oxide film 102 and the oxide semiconductor film 105.

When the oxide semiconductor film including a crystalline region is manufactured, the surface of the metal oxide film 102 is preferably planarized. There is no limitation on the method of planarizing treatment; polishing treatment (e.g., chemical mechanical polishing (CMP)), dry-etching treatment, plasma treatment, or a combination of these can be performed. As the plasma treatment, for example, reverse sputtering in which an argon gas is introduced and plasma is generated can be performed. The reverse sputtering is a method in which voltage is applied to a substrate side with use of an RF power source in an argon atmosphere and plasma is generated in the vicinity of the substrate so that a substrate surface is modified.

The degree of planarization is preferably as follows: an average surface roughness (Ra) of 1 nm or less, preferably 0.3 nm or less, and more preferably 0.1 nm or less. Note that Ra is obtained by expanding arithmetic average roughness, which is defined by JIS B0601: 2001 (ISO4287: 1997), into three dimensions so as to be applicable to a curved surface, and Ra is represented by an "average value of the absolute values of deviations from a reference surface to a specific surface". Such planarization of the surface of the metal oxide film 102 (or the base surface) is expected to allow the crystalline region in the oxide semiconductor film 105 to be formed at the interface with the base or the vicinity thereof.

The metal oxide film 102 is not necessarily a single layer, and may have a layered structure including a plurality of films. In that case, only a layer touching the oxide semiconductor film 104 needs to satisfy the aforementioned conditions (material, melting point, planarity, and the like). For example, the metal oxide film 102 can have a layered structure of a silicon oxide film and an aluminum oxide film. In that case, the aluminum oxide film may be provided in contact with the oxide semiconductor film.

Figure 2A:
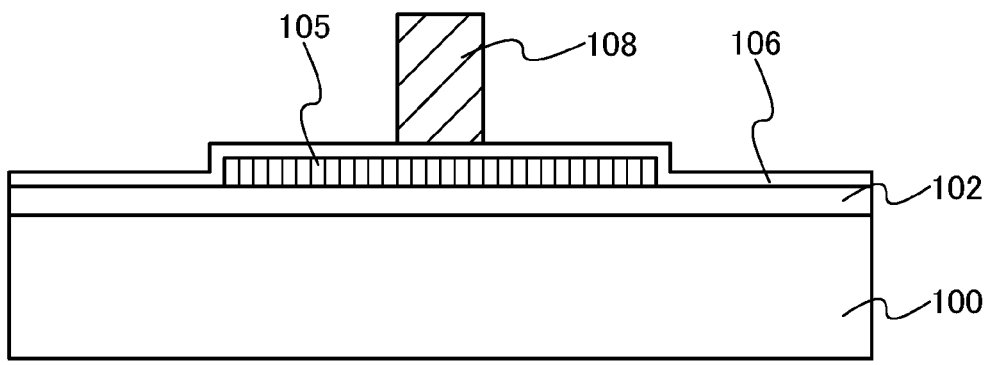
FIGS. 2A to 2C are diagrams illustrating a method for manufacturing a top-gate transistor according to one embodiment of the present invention.
Figure 2B:
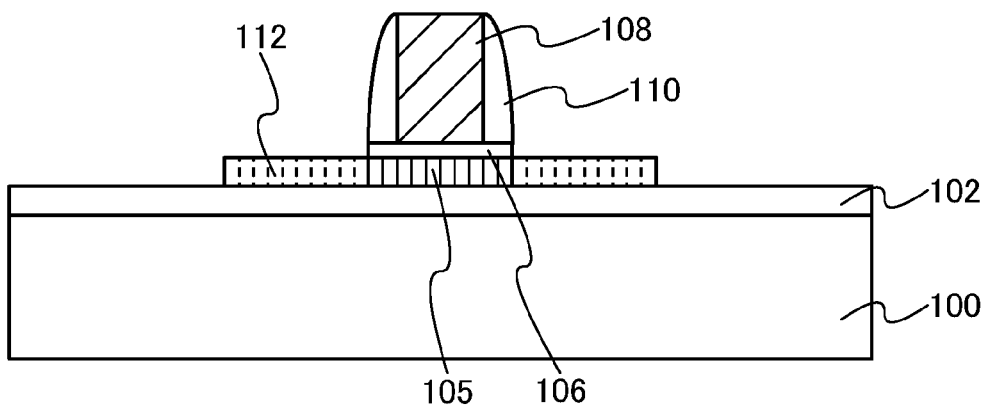
Figure 2C:
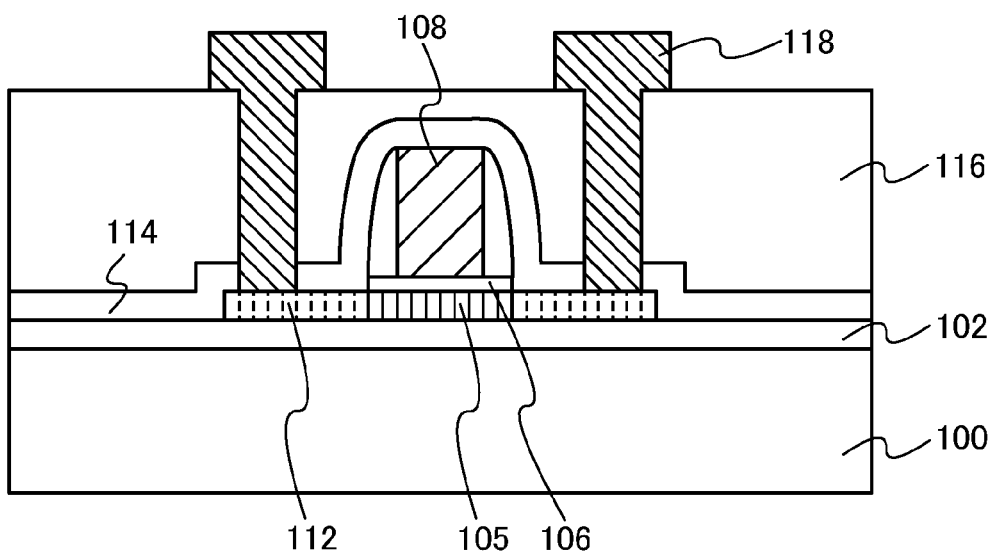

Next, a method for manufacturing a semiconductor device using the non-single-crystal oxide semiconductor film 105 will be described with reference to FIGS. 2A to 2C. FIGS. 2A to 2C illustrate manufacturing steps of a transistor which is an element of the semiconductor device. In FIGS. 2A to 2C, a top-gate transistor is illustrated as an example.

In FIG. 2A, the metal oxide film 102, the oxide semiconductor film 105, a gate insulating film 106, and a gate electrode 108 are formed over the substrate 100. The metal oxide film 102 and the oxide semiconductor film 105 are similar to those illustrated in FIGS. 1A and 1B. The oxide semiconductor film 105 may be processed into an island shape by etching in accordance with the shape of the transistor.

The substrate 100 can be made of various kinds of materials such as glass, metals, or semiconductors. The metal oxide film 102 is formed of an insulating metal oxide. The film made of an insulating metal oxide can be manufactured by sputtering, evaporation, or vapor deposition. As described above, aluminum oxide or gallium oxide, which is an oxide of an element belonging to Group 13 or an element of Group 3 which has a property similar to that of the element of Group 13, is preferably used for the metal oxide film 102. Such a metal oxide preferably contains a larger amount of oxygen as compared to the amount in the stoichiometric ratio of the metal oxide, which allows oxygen to be supplied to the oxide semiconductor film 105 in contact with the metal oxide film 102, and prevents generation of oxygen deficiency in the oxide semiconductor film 105.

The oxide semiconductor film 105 may have a thickness of 1 nm to 200 nm (preferably 5 nm to 30 nm). Note that the oxide semiconductor film 105 preferably contains a large amount of oxygen (preferably has a region including an excess amount of oxygen as compared to the amount in the stoichiometric ratio of an oxide semiconductor in a crystalline state). This is to prevent generation of defects due to oxygen deficiency in the oxide semiconductor film 105.

The gate insulating film 106 can be formed using a silicon oxide film, a gallium oxide film, an aluminum oxide film, a silicon nitride film, a silicon oxynitride film, an aluminum oxynitride film, or a silicon nitride oxide film. A portion of the gate insulating film 106, which is in contact with the oxide semiconductor film 105, preferably contains oxygen. In the gate insulating film 106, oxygen in a film (a bulk) preferably exists in an amount of at least more than the amount in the stoichiometric ratio; for example, in the case where a silicon oxide film is used as the gate insulating film 106, the composition formula is $SiO_{2+\alpha}$ ($\alpha>0$). Similarly, in the case where aluminum oxide is used, the composition formula is $Al_2O_{3+\alpha}$ ($\alpha>0$).

Further, gate leakage current can be reduced when the gate insulating film 106 is formed using a high-k material such as hafnium oxide, yttrium oxide, hafnium silicate ($HfSi_xO_y$ ($x>0$, $y>0$)), hafnium silicate to which nitrogen is added ($HfSiO_xN_y$ ($x>0$, $y>0$)), hafnium aluminate ($HfAl_xO_y$ ($x>0$, $y>0$)), or lanthanum oxide. In addition, the gate insulating film 106 may have a single-layer structure or a layered structure.

The gate insulating film 106 has a thickness of 1 nm to 100 nm, and can be formed by sputtering, MBE, CVD, pulse laser deposition, ALD, or the like as appropriate. The gate insulating film 106 may also be formed using a sputtering apparatus with which deposition is performed with surfaces of a plurality of substrates set substantially perpendicular to a surface of a sputtering target.

The gate electrode 108 can be formed of: a metal material such as molybdenum, titanium, tantalum, tungsten, aluminum, copper, chromium, neodymium, or scandium; an alloy material which includes any of these materials as a main component; polycrystalline silicon doped with an impurity element such as phosphorus; silicide such as nickel silicide; indium tin oxide; indium oxide containing tungsten oxide; indium zinc oxide containing tungsten oxide; indium oxide containing titanium oxide; indium tin oxide containing titanium oxide; indium zinc oxide; indium tin oxide to which silicon oxide is added; or a metal oxide containing nitrogen, specifically an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film. If the gate electrode 108 is made of a material having a work function of 5 eV or higher, preferably 5.5 eV or higher, the transistor can have a positive threshold voltage, whereby a so-called normally-off transistor can be obtained.

In FIG. 2B, sidewall insulating films 110 on the gate electrode 108, and low-resistance regions 112 are formed. The low-resistance regions 112 are used as a source region and a drain region of the transistor. The sidewall insulating films 110 may be formed of an insulating material as appropriate.

The low-resistance regions 112 have a resistance lower than that of a channel formation region (a region of the oxide semiconductor film 105, which substantially overlaps the gate electrode 108). The low-resistance regions 112 can be formed by adding any of the following elements as a dopant: the elements of Group 15 (typically phosphorus, arsenic, and antimony), boron, aluminum, nitrogen, argon, helium, neon, indium, fluorine, chlorine, titanium, and zinc.

The low-resistance regions 112 can be formed in such a manner that ions of any of the aforementioned elements are added to the oxide semiconductor film 105 by an ion implantation method, an ion doping method, a plasma immersion ion implantation method, or the like. For example, in the case where boron is added to the oxide semiconductor film 105 by the ion implantation method, the acceleration voltage and the dosage may be set to 5 kV to 30 kV and $1\times10^{13}$ ions/cm$^2$ to $5\times10^{16}$ ions/cm$^2$, respectively. In any case, the low-resistance regions 112 preferably contain a dopant at a concentration of $5\times10^{18}$/cm$^3$ to $1\times10^{22}$/cm$^3$.

In FIG. 2C, a passivation film 114, an interlayer insulating film 116, and wirings 118 are formed.

The passivation film 114 is preferably formed of the same kind of material as the metal oxide film 102. That is, the passivation film 114 is made of a material containing an element of Group 13 which is the same group as one of the elements included in the oxide semiconductor film 105, or an element of Group 3 which has a property similar to that of the element of Group 13, whereby contamination of the oxide semiconductor film 105 with a different kind of element can be prevented while heat resistance is maintained. Aluminum oxide is one of the preferable materials of the passivation film 114, which is suitable because of its high barrier properties against hydrogen and moisture.

Heat treatment may be performed before or after the passivation film 114 is formed. The heat treatment is preferably performed in an oxygen atmosphere or a dry air atmosphere (with a water content of 20 ppm or less, preferably 1 ppm or less, and more preferably 10 ppb or less), and the heating temperature may be 100° C. to 700° C., preferably 200° C. to 400° C. This treatment is expected to allow oxygen to be supplied to the oxide semiconductor film 105 from the insulating films touching the oxide semiconductor film 105 (the metal oxide film 102, the gate insulating film 106, and the passivation film 114), which leads to reduction in oxygen deficiency.

The interlayer insulating film 116 may be formed of an inorganic insulating material such as silicon oxide or an organic insulating material such as polyimide or acrylic. The wirings 118 can be formed using a metal film including an element selected from aluminum, chromium, copper, tantalum, titanium, molybdenum, and tungsten; a metal nitride film including any of the above elements as a component (a titanium nitride film, a molybdenum nitride film, or a tungsten nitride film); or the like. Alternatively, the wirings 118 may have a structure in which a film of a high-melting-point metal such as titanium, molybdenum, or tungsten, or a nitride film of any of these metals (a titanium nitride film, a molybdenum nitride film, or a tungsten nitride film) is stacked on either or both of the bottom surface and the top surface of a metal film of aluminum, copper, or the like.

When the transistor is manufactured in such a manner, the crystallinity is improved particularly in the channel formation region of the oxide semiconductor film 105, so that high field-effect mobility can be obtained. That is, a crystalline region with c-axis alignment exists in close contact with the metal oxide film, so that suppressed variation in threshold voltage as well as a reduction in interface states and an increase in field-effect mobility can be expected. Similarly to a silicon integrated circuit, a top-gate transistor can be manufactured by a planar process (a process in which an element and a terminal electrode of the element are formed over the same plane surface), which is advantageous in miniaturization of the transistor. Accordingly, the transistor can be used not only for a pixel matrix of a display panel, but also for a memory and logic circuit.

Figure 3A:
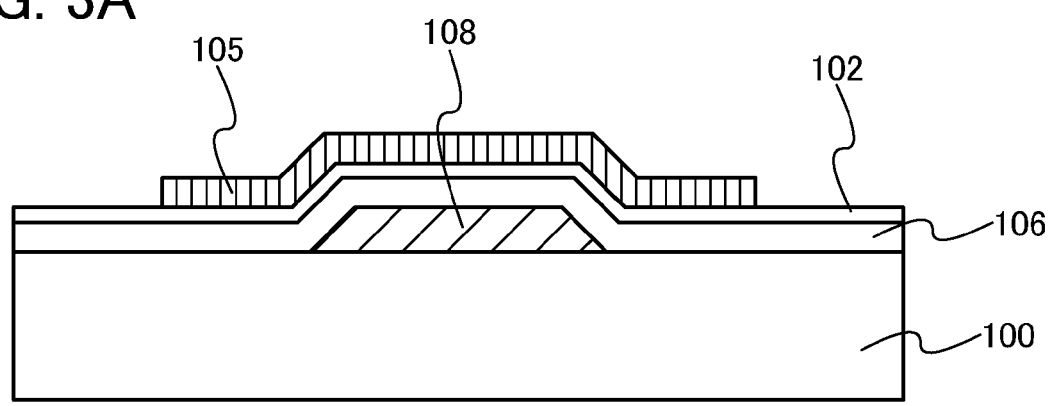
FIGS. 3A and 3B are diagrams illustrating a method for manufacturing a bottom-gate transistor according to one embodiment of the present invention.
Figure 3B:
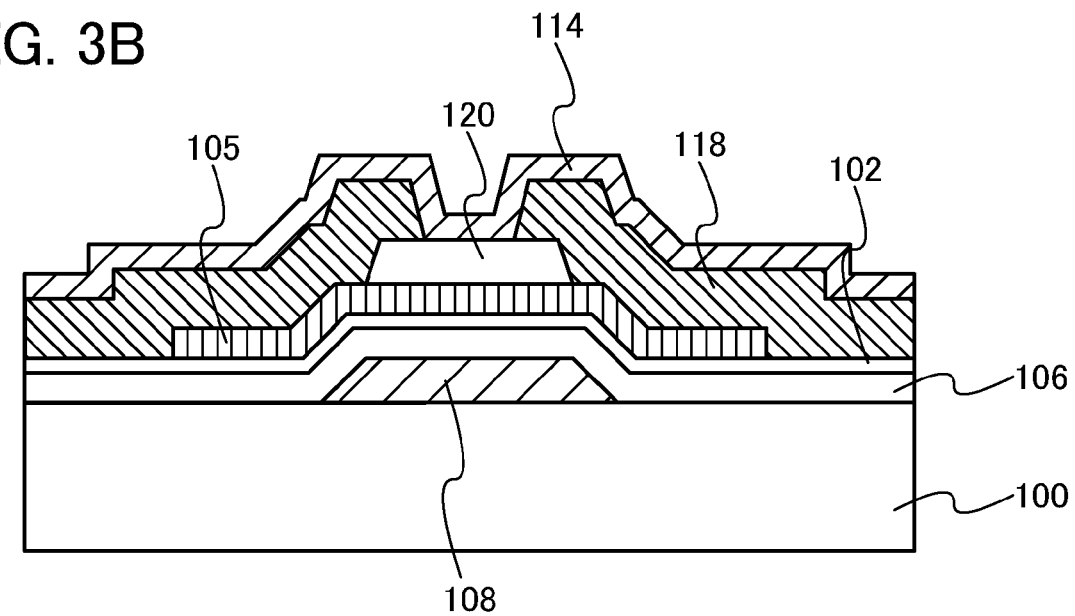

Next, a method for manufacturing a semiconductor device using the non-single-crystal oxide semiconductor film 105, which is different from that illustrated in FIGS. 2A to 2C, will be described with reference to FIGS. 3A and 3B. In FIGS. 3A and 3B, a bottom-gate transistor is illustrated as an example.

As illustrated in FIG. 3A, in the bottom-gate transistor, the gate electrode 108, the gate insulating film 106, and the oxide semiconductor film 105 are formed in order over the substrate 100. A layer corresponding to the metal oxide film 102 is provided between the gate insulating film 106 and the oxide semiconductor film 105. The metal oxide film 102 has an effect similar to that described with reference to FIGS. 2A to 2C. The metal oxide film 102 is formed of an insulating metal oxide and thus practically functions as a gate insulating film. Therefore, the metal oxide film 102 illustrated in FIG. 3A can be omitted if the gate insulating film 106 is formed of a material containing an element of Group 13 which is the same group as one of the elements included in the oxide semiconductor film 105, or an element of Group 3 which has a property similar to that of element of Group 13.

In FIG. 3B, a pair of wirings 118 is provided in contact with the oxide semiconductor film 105 including a crystalline region. Furthermore, as illustrated in FIG. 3B, an insulating layer 120 serving as a channel protective film may be provided so as to substantially overlap a region (a channel formation region) of the oxide semiconductor film 105, which overlaps the gate electrode 108. Since the insulating layer 120 is in contact with the oxide semiconductor film 105, it is preferably made of the same kind of insulating material as the metal oxide film 102.

The passivation film 114 is provided over the wirings 118 so as to cover the oxide semiconductor film 105, and made of a material containing an element of Group 13 which is the same group as one of the elements included in the oxide semiconductor film 105, or an element of Group 3 which has a property similar to that of the element of Group 13, whereby contamination of the oxide semiconductor film 105 with a different kind of element can be prevented while heat resistance is maintained. Aluminum oxide is one of the preferable materials of the passivation film 114, which is suitable because of its high barrier properties against hydrogen and moisture. Further, before or after the passivation film 114 is formed, heat treatment may be performed in an oxygen atmosphere or a dry air atmosphere (with a water content of 20 ppm or less, preferably 1 ppm or less, and more preferably 10 ppb or less).

When the transistor is manufactured in such a manner, the crystallinity is improved particularly in the channel formation region of the oxide semiconductor film 105, so that high field-effect mobility can be obtained. That is, a crystalline region with c-axis alignment exists in close contact with the metal oxide film, whereby suppressed variation in threshold voltage as well as a reduction in interface density and an increase in field-effect mobility can be expected.

Example 1

In this example, an oxide semiconductor film according to one embodiment of the present invention is formed and observed using a transmission electron microscope (TEM), and the results thereof will be described.

In this example, a sample A was manufactured: a silicon oxide film (with a thickness of 300 nm) was deposited over a glass substrate (AN100 manufactured by Asahi Glass Co., Ltd.), an aluminum oxide film (with a thickness of 20 nm) was deposited over the silicon oxide film, and an IGZO film (with a thickness of 30 nm) was deposited as an oxide semiconductor film over the aluminum oxide film. As a comparative example, a sample B was manufactured: a silicon oxide film (with a thickness of 300 nm) was deposited over a glass substrate (AN100 manufactured by Asahi Glass Co., Ltd.), and an IGZO film (with a thickness of 30 nm) was deposited as an oxide semiconductor film over the silicon oxide film.

That is to say, in the sample A, the aluminum oxide film serves as a base insulating film of the IGZO film; and in the sample B, the silicon oxide film serves as a base insulating film of the IGZO film.

Manufacturing processes of the sample A and the sample B will be described below.

First, in the sample A and the sample B, a silicon oxide film was formed over a glass substrate so as to have a thickness of 300 nm. The silicon oxide film was deposited by sputtering under the following conditions: target, silicon oxide ($SiO_2$); Ar gas flow rate, 25 sccm; $O_2$ gas flow rate, 25 sccm; pressure, 0.4 Pa; substrate temperature, 100° C.; and high-frequency (RF) power, 2 kW.

Furthermore, in the sample A, an aluminum oxide film was formed over the silicon oxide film so as to have a thickness of 20 nm. The aluminum oxide film was deposited by sputtering under the following conditions: target, aluminum oxide ($Al_2O_3$); Ar gas flow rate, 25 sccm; $O_2$ gas flow rate, 25 sccm; pressure, 0.4 Pa; substrate temperature, 250° C.; and high-frequency (RF) power, 1.5 kW. In this manner, the aluminum oxide film serves as a base insulating film of an IGZO film in the sample A.

In the sample B, the surface of the silicon oxide film was subjected to chemical mechanical polishing (CMP) treatment. The CMP treatment was performed using a polyurethane-based polishing cloth and silica-based slurry so that the average surface roughness (Ra) of the silicon oxide film was 0.2 nm. The treatment temperature was room temperature, the polishing pressure was 0.001 MPa, the spindle rotation speed was 56 rpm, and the table rotation speed was 60 rpm. After the CMP treatment, the sample B was soaked in ozone water for 30 seconds to be cleaned. The silicon oxide film with the thus planarized surface serves as a base insulating film of an IGZO film in the sample B.

Then, in each of the sample A and the sample B, an In—Ga—Zn—O-based oxide semiconductor film (IGZO film) was deposited over the base insulating film so as to have a thickness of 30 nm. The IGZO film was deposited by sputtering using a target having a composition of $In_2O_3$:$Ga_2O_3$:ZnO=1:1:2 [molar ratio]. The deposition conditions in sputtering were as follows: pressure, 0.4 Pa; substrate temperature, 300° C.; and high-frequency (RF) power, 0.5 kW. As for the deposition gas flow rate, in the sample A, an Ar gas flow rate of 30 sccm and an $O_2$ gas flow rate of 15 sccm were satisfied, and in the sample B, an $O_2$ gas flow rate of 45 sccm was satisfied.

The IGZO films thus deposited in the sample A and the sample B were irradiated with a laser beam. A XeCl excimer laser (with a wavelength of 308 nm) was used as a laser oscillator, and the number of beam shots was set to about 10. The laser beam irradiation was performed at room temperature in the air while the irradiation surface was sprayed with an oxygen gas. Note that the energy density of the laser beam was 349 mJ/$cm^2$ and 325 mJ/$cm^2$ in the sample A and the sample B, respectively.

Figure 4:
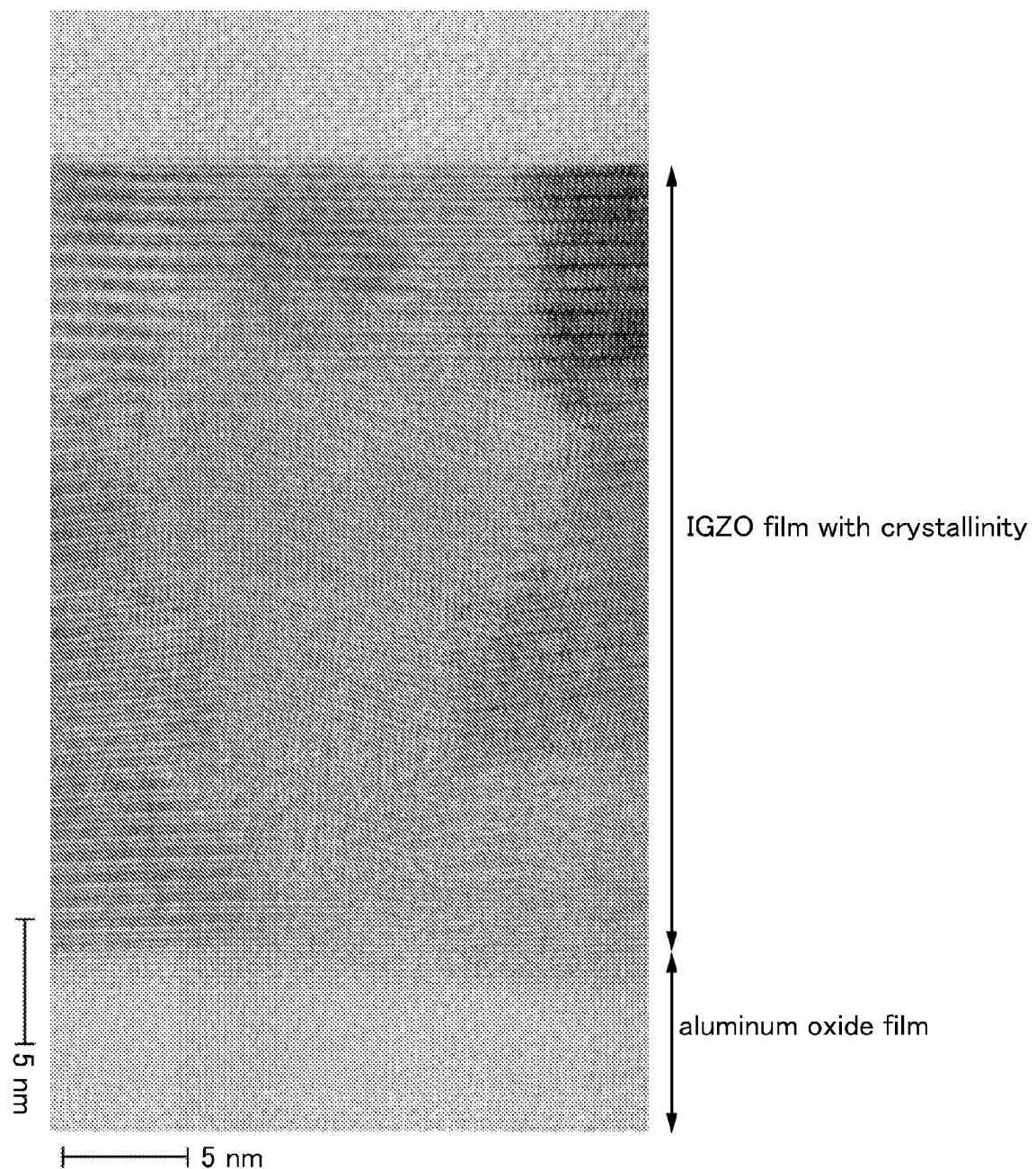
FIG. 4 is a cross-sectional TEM image of a sample according to one example of the present invention.
Figure 5:
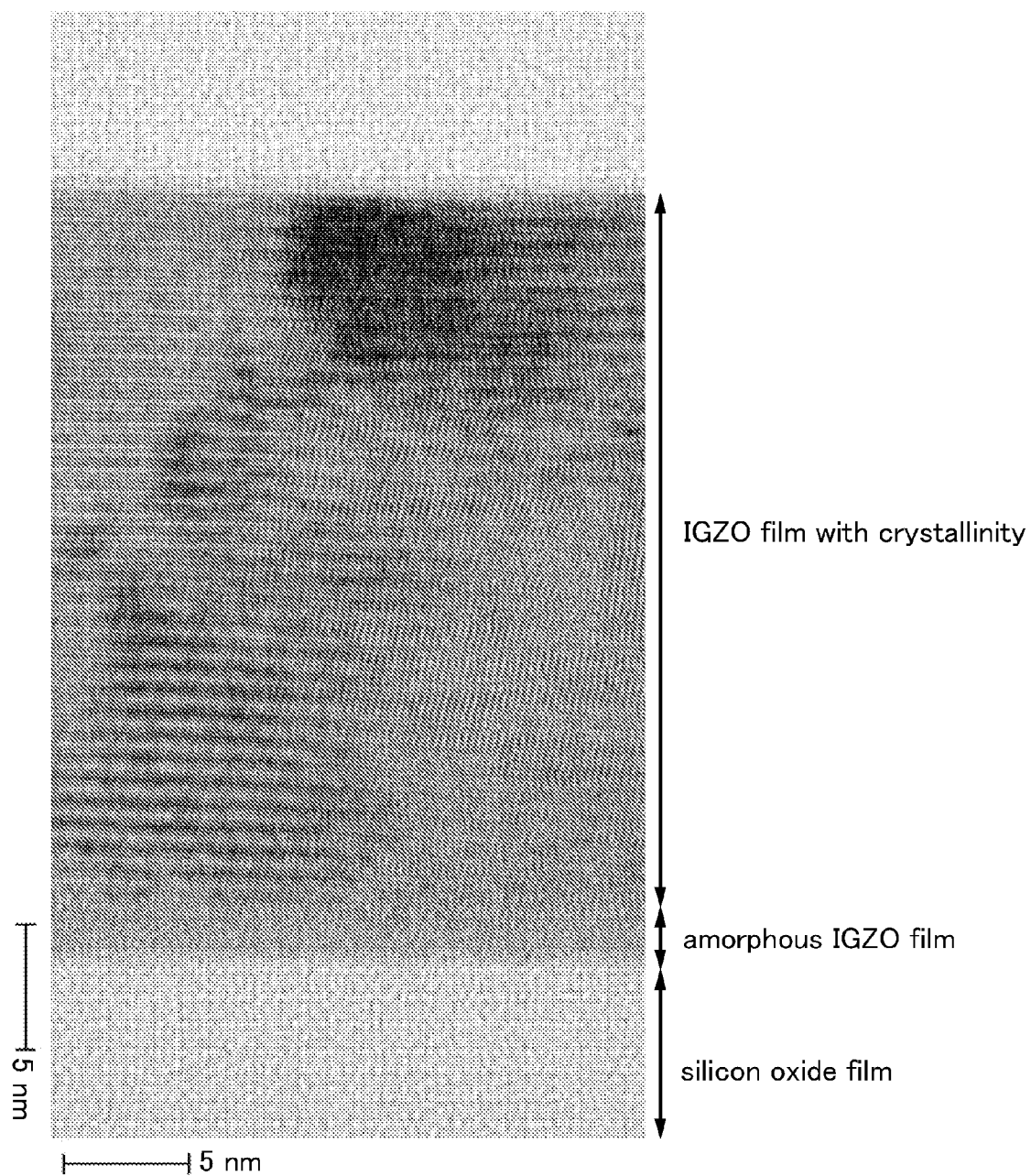
FIG. 5 is a cross-sectional TEM image of a sample according to one example of the present invention.

FIG. 4 and FIG. 5 are cross-sectional TEM images of the sample A and the sample B, respectively, which were taken with a TEM. FIG. 4 is a cross-sectional TEM image of the sample A at 4000000-fold magnification and FIG. 5 is a cross-sectional TEM image of the sample B at 4000000-fold magnification. Note that in this example, the cross-sectional TEM images were taken using H-9000NAR manufactured by Hitachi High-Technologies Corporation, with an accelerating voltage of 300 kV.

FIG. 4 shows that in the sample A, the IGZO film formed over the aluminum oxide film has a lattice pattern from the surface of the IGZO film to the interface between the aluminum oxide film and the IGZO film, and thus has crystallinity. In particular, in a region of 2 nm or less from the interface between the aluminum oxide film and the IGZO film, a lattice pattern can be observed in the IGZO film. In addition, a layered lattice pattern can be observed in the IGZO film with crystallinity, which shows that the IGZO film includes a crystal having a c-axis substantially perpendicular to the surface of the IGZO film.

FIG. 5 shows that in the sample B, the IGZO film formed over the silicon oxide film has a lattice pattern from the surface of the IGZO film to a region shallower than the interface between the silicon oxide film and the IGZO film, and thus has crystallinity. Further, like in the sample A, a layered lattice pattern is observed in the IGZO film with crystallinity, which shows that the IGZO film includes a crystal having a c-axis substantially perpendicular to the surface of the IGZO film. However, in the vicinity of the interface between the silicon oxide film and the IGZO film, particularly in a region of 2 nm or less from the interface between the silicon oxide film and the IGZO film, a lattice pattern cannot be observed and the IGZO film is made amorphous.

Table 1 shows the melting points of the respective components in the IGZO film ($In_2O_3$, $Ga_2O_3$, ZnO), the aluminum oxide film ($Al_2O_3$), and the silicon oxide film ($SiO_2$), which were used in the sample A and the sample B. Note that melting points a are values extracted from *New Vacuum Handbook* edited by Ulvac Inc. (Ohmsha); and melting points b are values extracted from *Iwanami Physical and Chemical Dictionary* 4$^{th}$ *edition* edited by Ryogo KUBO, Saburo NAGAKURA, Hiroo INOKUCHI, and Hiroshi EZAWA (Iwanami Shoten).

TABLE 1

| Material | | melting point a (° C.) | melting point b (° C.) |
|---|---|---|---|
| IGZO | $In_2O_3$ | 1565 | 1910 |
| | $Ga_2O_3$ | 1900 | 1740 |
| | ZnO | 1975 | 1980 |
| Base insulating film | $Al_2O_3$ | 2020 | 2050 |
| | $SiO_2$ | 1614-1710 | 1730 |

Table 1 shows that the aluminum oxide film used as the base insulating film in the sample A has a melting point higher than that of each metal oxide contained in the IGZO film. On the contrary, the silicon oxide film used as the base insulating film in the sample B has a melting point lower than that of each metal oxide contained in the IGZO film with the exception of some components.

From the above, it is deduced that in the sample B, the silicon oxide film having a melting point lower than that of each component in the IGZO film is melted when the IGZO film is melted by laser irradiation. Furthermore, recrystallization of the IGZO film might be inhibited because of silicon atoms entering the IGZO film at the interface between the IGZO film and the silicon oxide film.

On the other hand, in the sample A, it is deduced that the aluminum oxide film is not melted when the IGZO film is melted by laser irradiation because the aluminum oxide film functioning as the base insulating film has a melting point higher than that of each component in the IGZO film. It is thus thought that the aluminum oxide film does not inhibit recrystallization of IGZO and the IGZO film is crystallized with regular alignment even in the vicinity of the interface between the IGZO film and the aluminum oxide film.

From the above, it was found that an IGZO film with good crystallinity could be formed when the IGZO film was deposited over an aluminum oxide film and irradiated with a laser beam to be recrystallized.

Example 2

In this example, an oxide semiconductor film according to one embodiment of the present invention is formed, the oxide semiconductor film is observed using a TEM and analyzed by electron diffraction measurement, and the results will thereof be described.

In this example, a sample C was manufactured: a silicon oxide film (with a thickness of 300 nm) was deposited over a glass substrate (AN100 manufactured by Asahi Glass Co., Ltd.), an yttria-stabilized zirconia (YSZ) film (with a thickness of 10 nm) was deposited over the silicon oxide film, and an IGZO film (with a thickness of 20 nm) was deposited as an oxide semiconductor film over the YSZ film.

That is to say, in the sample C, the YSZ film serves as a base insulating film of the IGZO film.

Manufacturing process of the sample C will be described below.

First, a silicon oxide film was formed over a glass substrate so as to have a thickness of 300 nm. The silicon oxide film was deposited by sputtering under the following conditions: target, silicon oxide ($SiO_2$); Ar gas flow rate, 25 sccm; $O_2$ gas flow rate, 25 sccm; pressure, 0.4 Pa; substrate temperature, 100° C.; and high-frequency (RF) power, 2 kW.

Then, the surface of the silicon oxide film was subjected to CMP treatment. The CMP treatment was performed using a polyurethane-based polishing cloth and silica-based slurry so that the average surface roughness (Ra) of the silicon oxide film was 0.15 nm. The treatment temperature was room temperature, the polishing pressure was 0.001 MPa, the spindle rotation speed was 56 rpm, and the table rotation speed was 60 rpm. After the CMP treatment, the sample C was soaked in ozone water for 30 seconds to be cleaned.

Next, a YSZ film was formed over the silicon oxide film so as to have a thickness of 10 nm. The YSZ film was deposited by sputtering using a target having a composition of $ZrO_2$:$Y_2O_3$=92:8 [molar ratio]. The deposition conditions were as follows: Ar gas flow rate, 20 sccm; $O_2$ gas flow rate, 20 sccm; pressure, 0.4 Pa; substrate temperature, room temperature; and high-frequency (RF) power, 0.5 kW. The thus deposited YSZ film serves as a base insulating film of the IGZO film in the sample C.

Then, an In—Ga—Zn—O-based oxide semiconductor film (IGZO film) was deposited over the YSZ film so as to have a thickness of 20 nm. The IGZO film was deposited by sputtering using a target having a composition of $In_2O_3$:$Ga_2O_3$:ZnO=1:1:2 [molar ratio]. The deposition conditions in sputtering were as follows: $O_2$ gas flow rate, 45 sccm; pressure, 0.4 Pa; substrate temperature, 300° C.; and high-frequency (RF) power, 0.5 kW.

The thus deposited IGZO film was irradiated with a laser beam. A XeCl excimer laser (with a wavelength of 308 nm) was used as a laser oscillator, and the number of beam shots was set to about 10. The laser beam irradiation was performed at room temperature in the air while the irradiation surface was sprayed with an oxygen gas. Note that the energy density of the laser beam was 580 mJ/cm$^2$.

Figure 6:
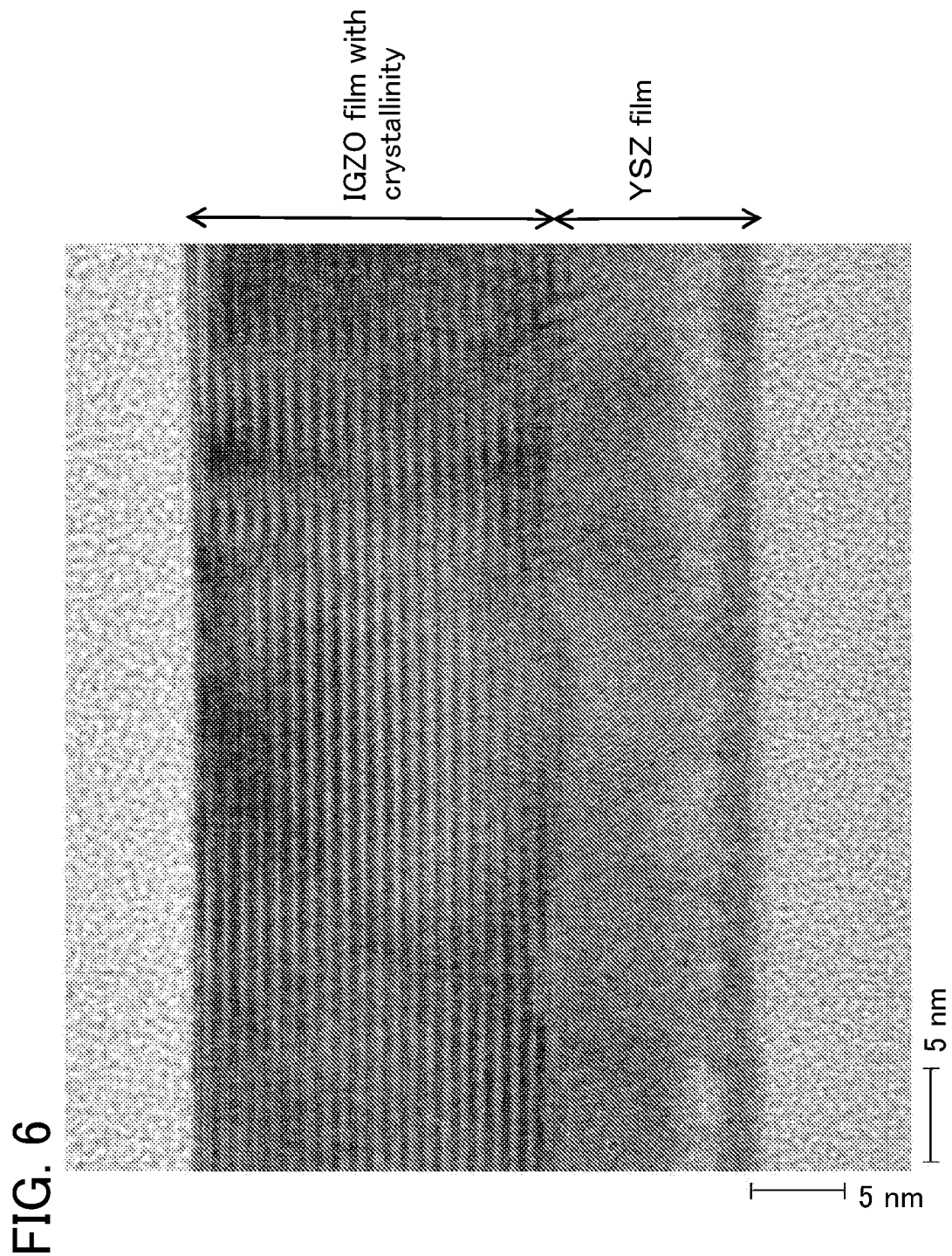
FIG. 6 is a cross-sectional TEM image of a sample according to one example of the present invention.

FIG. 6 is a cross-sectional TEM image of the sample C, which was taken with a TEM. FIG. 6 is a cross-sectional TEM image of the sample C at 4000000-fold magnification. Note that in this example, the cross-sectional TEM image was taken using H-9000NAR manufactured by Hitachi High-Technologies Corporation, with an accelerating voltage of 300 kV.

FIG. 6 shows that in the sample C, like in the sample A, the IGZO film formed over the YSZ film has a lattice pattern from the surface of the IGZO film to the interface between the YSZ film and the IGZO film, and thus has crystallinity. In particular, in a region of 2 nm or less from the interface between the YSZ film and the IGZO film, a lattice pattern can be observed in the IGZO film. In addition, a layered lattice pattern can be observed in the IGZO film with crystallinity, which shows that the IGZO film includes a crystal having a c-axis substantially perpendicular to the surface of the IGZO film.

Further, in the sample C, a lattice pattern can be observed also in the YSZ film, which shows that the YSZ film also has crystallinity. Note that different from the layered lattice pattern in the IGZO film, the arrangement of the lattice pattern in the YSZ film varies depending on area in the YSZ film. From this, it is deduced that the YSZ film has a polycrystalline structure.

In addition, electron diffraction images of the sample C were taken with a TEM. Note that in this example, the electron diffraction images were taken using HF-2000 manufactured by Hitachi High-Technologies Corporation, with an accelerating voltage of 200 kV.

Figure 7:
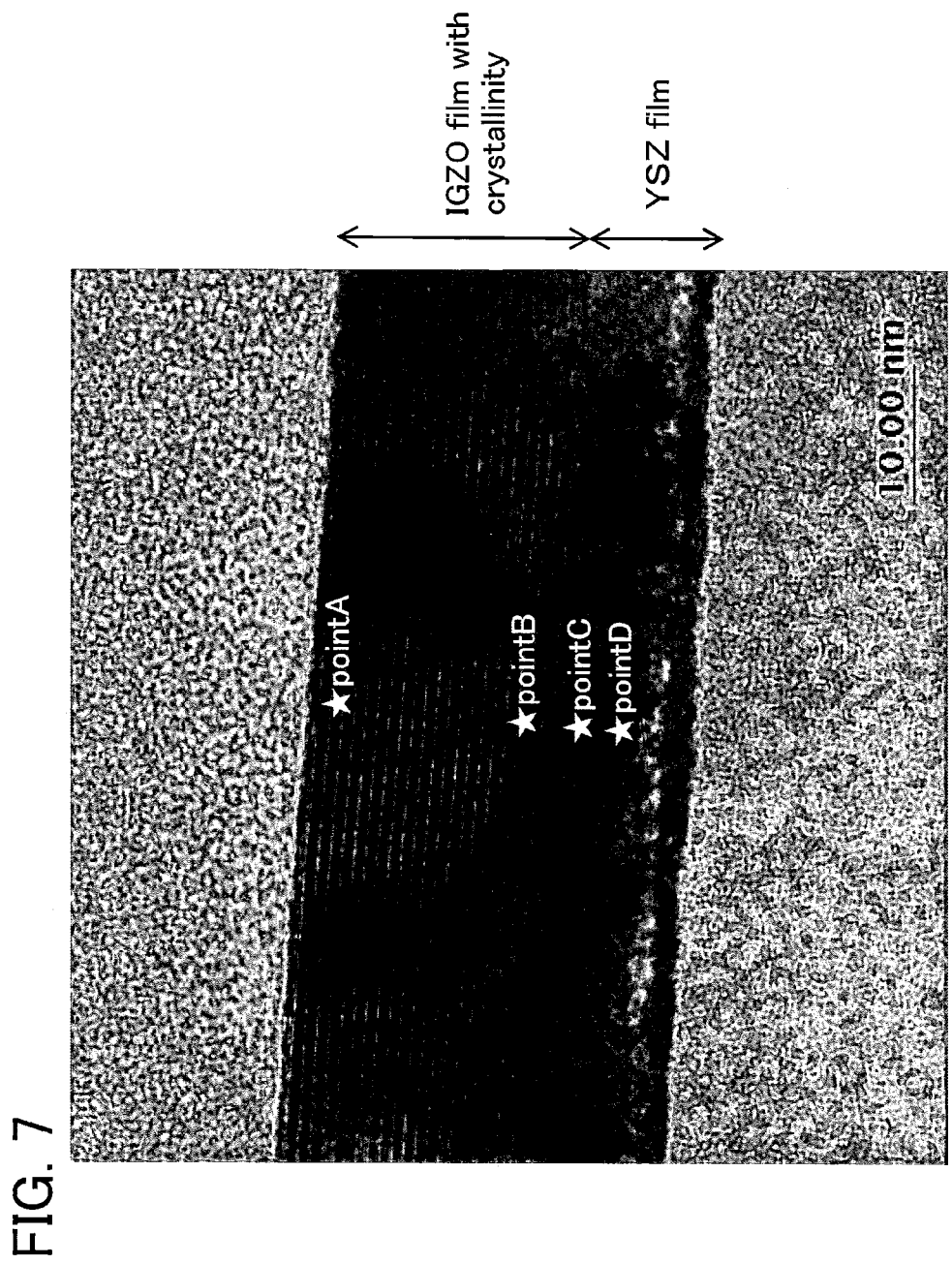
FIG. 7 is a cross-sectional TEM image of a sample according to one example of the present invention.

The electron diffraction images were taken at the four points shown in the cross-sectional TEM image of FIG. 7: point A (the upper portion of the IGZO film), point B (the vicinity of the interface between the IGZO film and the YSZ film, on the IGZO film side), point C (the vicinity of the interface between the IGZO film and the YSZ film, in the YSZ film side), and point D (the center of the YSZ film).

Figure 8A:
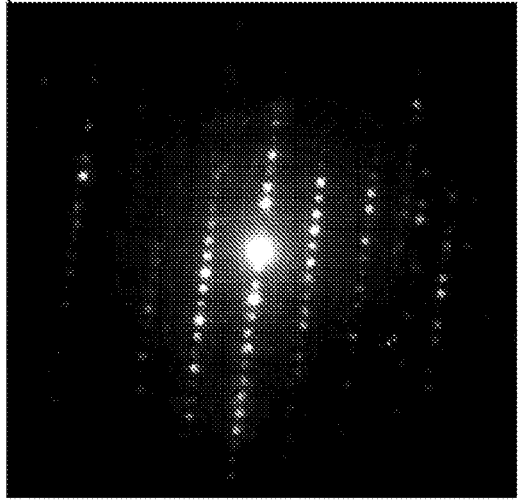
FIGS. 8A to 8D are electron diffraction images of a sample according to one example of the present invention.
Figure 8B:
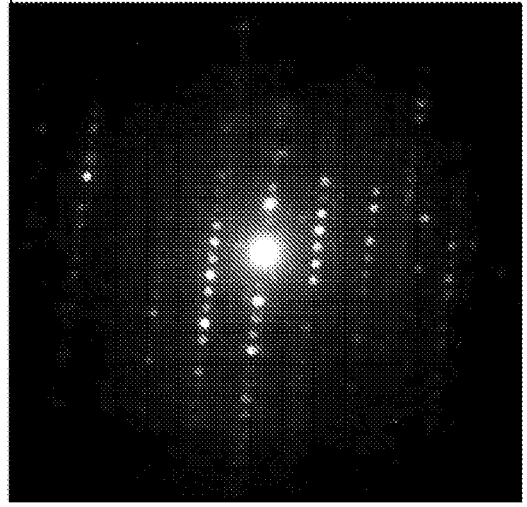

FIGS. 8A and 8B show that spot patterns appear in the electron diffraction images of the IGZO film and the IGZO film has high crystallinity. Almost the same spot pattern appears in the point A (the upper portion of the IGZO film) and the point B (the vicinity of the interface between the IGZO film and the YSZ film); accordingly, it is deduced that crystalline structures at the two points are substantially the same.

Figure 8C:
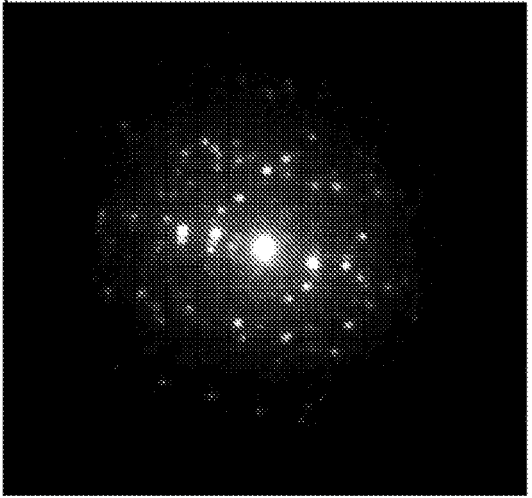
Figure 8D:
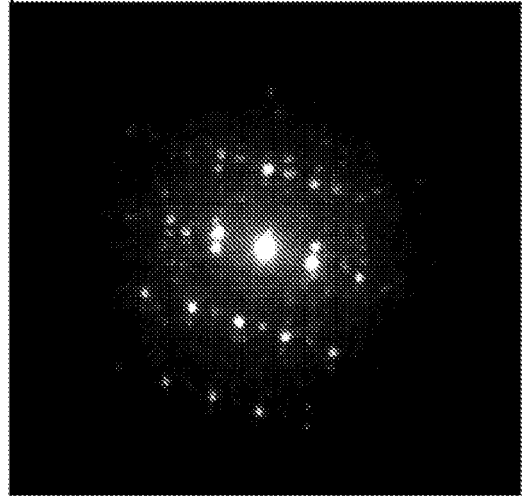

Further, FIGS. 8C and 8D show that spot patterns appear also in the electron diffraction images of the YSZ film and the YSZ film also has high crystallinity.

Here, as described in the above embodiment, the YSZ film used as the base insulating film in the sample C has a melting point of 2700° C., which is higher than that of each component in the IGZO film. Therefore, similarly to the aluminum oxide film shown in Example 1, it is deduced that the YSZ film is not melted when the IGZO film is melted by laser irradiation. It is thus thought that the YSZ film does not inhibit recrystallization of IGZO and the IGZO film is crystallized with regular alignment even in the vicinity of the interface between the IGZO film and the YSZ film.

From the above, it was found that an IGZO film with good crystallinity could be formed when the IGZO film was deposited over a YSZ film and irradiated with a laser beam to be recrystallized.

This application is based on Japanese Patent Application serial no. 2011-152143 filed with Japan Patent Office on Jul. 8, 2011, and Japanese Patent Application serial no. 2011-237087 filed with Japan Patent Office on Oct. 28, 2011, the entire contents of which are hereby incorporated by reference.

What is claimed is:

1. A method for manufacturing an oxide semiconductor film, comprising the steps of:
   forming a gallium oxide film;
   forming a first oxide semiconductor film on and in contact with the gallium oxide film; and
   heating the first oxide semiconductor film by irradiation with a laser beam, so that crystallinity of a region of the first oxide semiconductor film at an interface between the gallium oxide film and the oxide semiconductor film is increased,
   wherein the first oxide semiconductor film comprises gallium, indium and zinc, and
   wherein the region of the first oxide semiconductor film is a crystalline region with c-axis alignment.

2. The method for manufacturing an oxide semiconductor film, according to claim 1, wherein the region of the first oxide semiconductor film is in a region of 2 nm or less from the interface between the gallium oxide film and the oxide semiconductor film.

3. The method for manufacturing an oxide semiconductor film, according to claim 1, wherein the laser beam has energy higher than a band gap of the oxide semiconductor film.

4. A method for manufacturing a semiconductor device, comprising the steps of:
   forming a gallium oxide film;
   forming an oxide semiconductor film on and in contact with the gallium oxide film;
   irradiating the oxide semiconductor film with a laser beam, so that crystallinity of a region of the oxide semiconductor film at an interface between the gallium oxide film and the oxide semiconductor film is increased;
   forming a gate insulating film over the oxide semiconductor film; and
   forming a gate electrode over the gate insulating film,
   wherein the oxide semiconductor film contains gallium, indium and zinc, and
   wherein the region of the oxide semiconductor film is a crystalline region with c-axis alignment.

5. The method for manufacturing a semiconductor device, according to claim 4, wherein the region of the oxide semiconductor film is in a region of 2 nm or less from an interface between the gallium oxide film and the oxide semiconductor film.

6. The method for manufacturing a semiconductor device, according to claim 4, wherein the laser beam has energy higher than a band gap of the oxide semiconductor film.

7. A method for manufacturing an oxide semiconductor film, comprising the steps of:
   forming a gallium oxide film;
   forming a first oxide semiconductor film on and in contact with a surface of the gallium oxide film, an average surface roughness of the surface of the gallium oxide film is 1 nm or less; and
   heating the first oxide semiconductor film by irradiation with a laser beam, so that crystallinity of a region of the first oxide semiconductor film at an interface between the gallium oxide film and the oxide semiconductor film is increased,
   wherein the first oxide semiconductor film comprises gallium, indium and zinc, and wherein the region of the first oxide semiconductor film is a crystalline region with c-axis alignment.

8. The method for manufacturing an oxide semiconductor film, according to claim 7, wherein the region of the first oxide semiconductor film is in a region of 2 nm or less from the interface between the gallium oxide film and the oxide semiconductor film.

9. The method for manufacturing an oxide semiconductor film, according to claim 7, wherein the laser beam has energy higher than a band gap of the oxide semiconductor film.

10. The method for manufacturing an oxide semiconductor film, according to claim 7, further comprising a step of polishing an upper surface of the gallium oxide film to form the surface having the average surface roughness 1 nm or less.

* * * * *